April 9, 1974 P. A. RAGARD ET AL Re. 27,968

MULTISIZE VARIABLE CENTER ELECTRONIC COMPONENT INSERTION MACHINE

Original Filed Aug. 26, 1968 5 Sheets-Sheet 1

INVENTORS
PHILLIP A. RAGARD
GARY D. JOHNSON
BY Fidelman, Wolffe & Leitner
ATTORNEYS

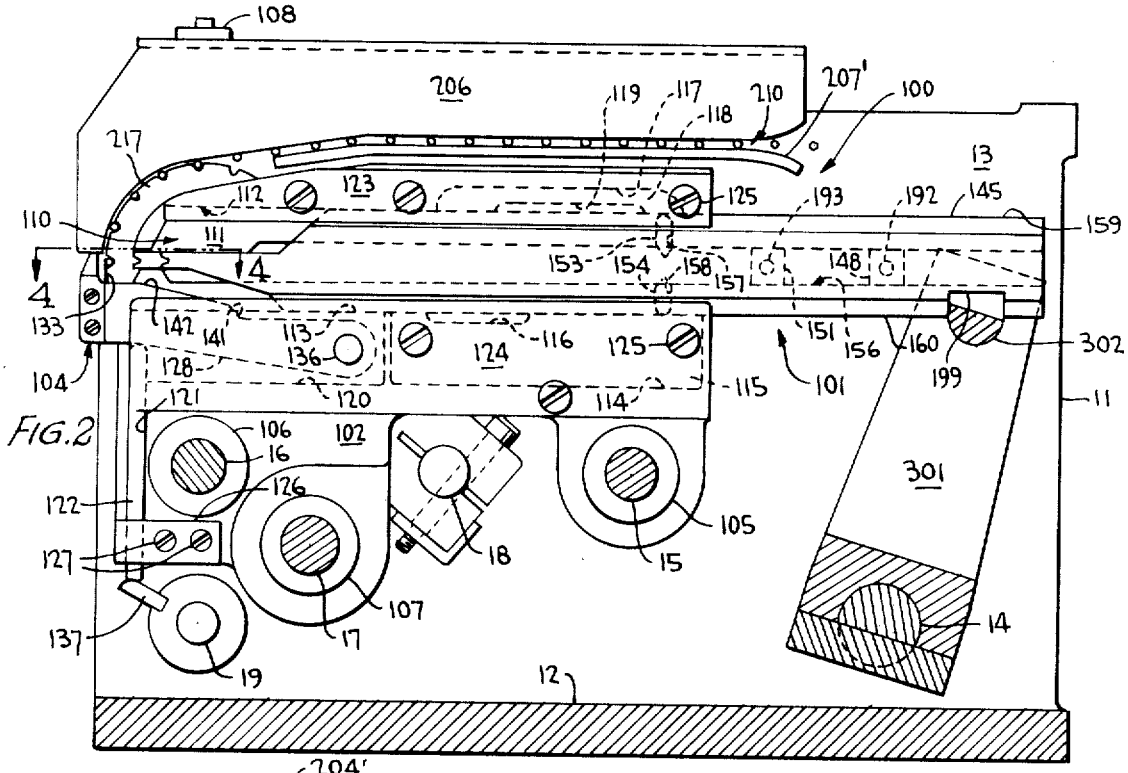
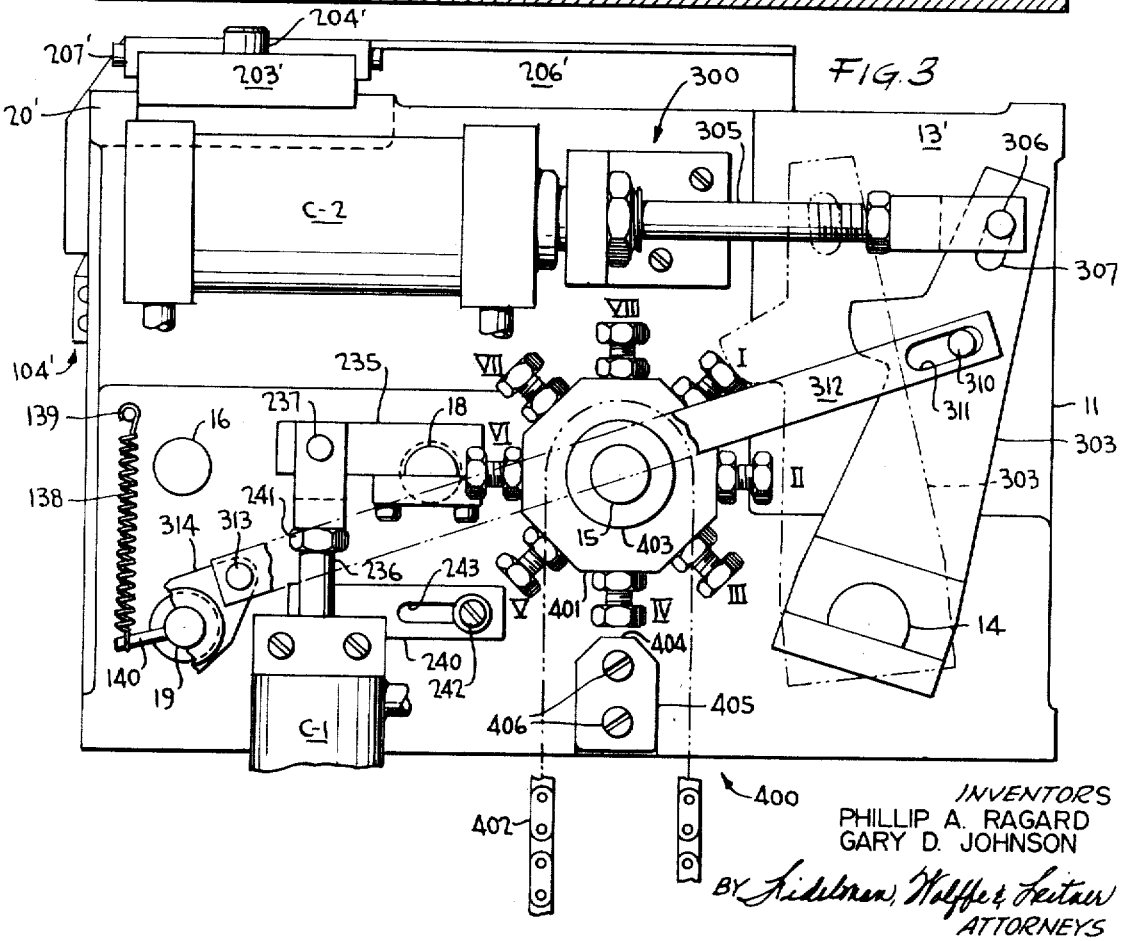
INVENTORS
PHILLIP A. RAGARD
GARY D. JOHNSON
BY Lidstone, Wolffe & Leitner
ATTORNEYS INVENTORS
PHILLIP A. RAGARD
GARY D. JOHNSON
BY Fidelman, Wolffe & Leitner
ATTORNEYS INVENTORS
PHILLIP A. RAGARD
GARY D. JOHNSON
BY Fidelman, Wolffe & Leitner
ATTORNEYS INVENTORS
PHILLIP A. RAGARD
GARY D. JOHNSON
BY Fidelman, Wolffe & Leitner
ATTORNEYS United States Patent Office Re. 27,968
Reissued Apr. 9, 1974

27,968

MULTISIZE VARIABLE CENTER ELECTRONIC COMPONENT INSERTION MACHINE

Phillip A. Ragard, Binghamton, and Gary D. Johnson, Endicott, N.Y., assignors to Universal Instruments Corporation, Binghamton, N.Y.

Original No. 3,539,086, dated Nov. 10, 1970, Ser. No. 755,233, Aug. 26, 1968. Application for reissue July 19, 1973, Ser. No. 380,692

Int. Cl. B27f *7/06*

U.S. Cl. 227—2 16 Claims

Matter enclosed in heavy brackets [ ] appears in the original patent but forms no part of this reissue specification; matter printed in italics indicates the additions made by reissue.

ABSTRACT OF THE DISCLOSURE

An insertion apparatus having an insertion head automatically adjustable to accommodate axial lead components having body portions of variable diameter and lengths.

The present invention is directed towards an improved insertion apparatus for axial lead components and more particularly to an insertion apparatus having an insertion head adapted to be automatically adjusted to accommodate axial lead components having body portions of varying diameters and lengths.

Heretofore, it has been proposed to feed tape carried axial lead components to an insertion head, which is adapted in sequence to sever the leads of a present component in order to separate such component from a pair of spaced carrier tapes; bend the severed leads at right angles to the axis of the separated component; and finally drive the bent leads into preformed apertures provided in a circuit board disposed below the insertion head.

Prior insertion apparatus of this type employ fixed insertion heads, wherein the component lead severing, bending and driving tools incorporated within the insertion head are not relatively adjustable, and include taped component feeding manganisms which are adapted to accommodate carrier tapes having a preset spacing between components. Thus, a given fixed insertion head is required to insert all components into a circuit board on a fixed lead center, designated as C.D., i.e. the distance between the axes of inserted leads, regardless of the body lengths of such components, and with a fixed spacing between the board surface and the axis of the components regardless of the component body diameter or thickness. Also, with present fixed head apparatus, it has not been possible to insure proper orientation of the component leads with respect to preformed circuit board apertures regardless of lead diameter, or to selectively accommodate carrier or supply tapes having variable spacing between components.

The limitations inherent in fixed insertion head apparatus not only limit the maximum possible density of components on a given board, but severely limit the versatility of circuit board design and terminal arrangement.

Accordingly, it is a primary object of the present invention to provide an insertion apparatus which overcomes the above mentioned disadvantages.

In accordance with the present invention there is provided an insertion head having a pair of insertion head sections which are relatively adjustable, so as to permit a component to be inserted into a board or any desired lead center or C.D. The ability of the apparatus to insert on variable lead centers not only permits versatility of circuit board design and terminal arrangement, but permits maximum circuit board density due to the fact that the lengths of the nondeformed portions of the leads which are arranged parallel to the surface of the circuit board may always be maintained at a minimum. Further, by permitting relative adjustment of the head sections the leads of the components, regardless of lead diameter or size may be accurately positioned with respect to preformed apertures provided in the circuit board.

The present invention additionally contemplates the forming of an insertion head in such a manner that the extent of travel of the driving tools of the inserter may be varied to obtain one of a number of preselected insertion positions, which are determined by the body portion diameters or thicknesses of the components to be inserted. This arrangement permits each component when inserted to be positioned in proper supporting engagement with the surface of the circuit board, and permits the driving tools of the insertion head to be positioned as close to the surface board as possible in order to insure proper clinching of the inserted leads.

The insertion apparatus of the present invention also includes an adjustable tape feeding arrangement, which permits the apparatus to process component carrier tapes having either standard nominal 200 or 375 thousands spacing between individual components or to accommodate tapes having variable component spacings along a given carrier tape.

The nature and mode of operation of the insertion apparatus of the present invention will be more clearly understood by reference to the following description taken with the accompanying drawings, wherein;

FIG. 2 is a sectional view taken generally along the line 2—2 of FIG. 1;

FIG. 3 is a side elevational view taken generally along the line 3—3 of FIG. 1;

Figure 1:
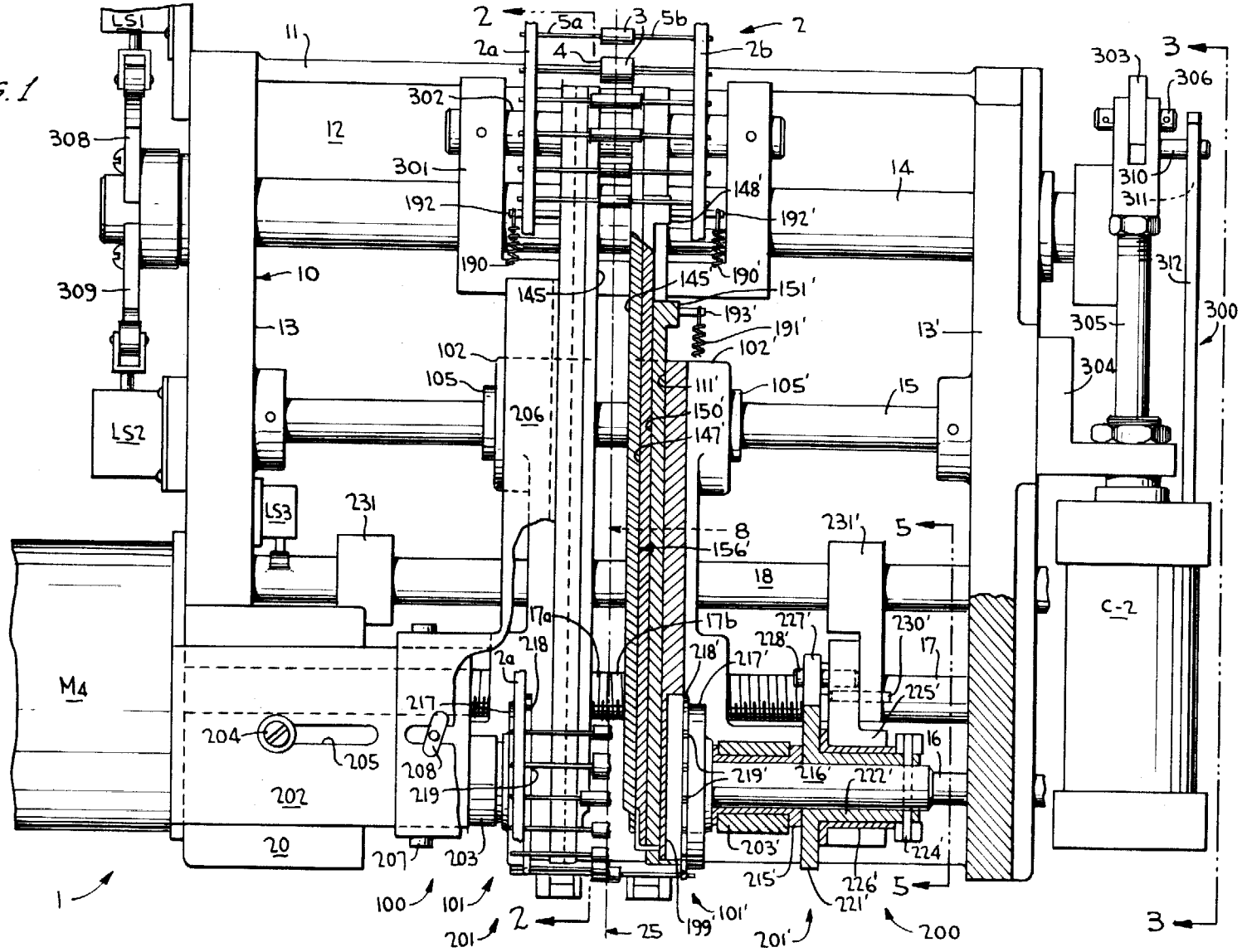
FIG. 1 is a front elevational view of the insertion apparatus according to the present invention having parts broken away for purposes of clarity.

The insertion apparatus of the present invention, which is generally designated as 1 in the drawings, is adapted to process axial lead insertion tapes of the type designated as 2 in FIG. 1, wherein a pair of spaced carrier tapes 2a, 2b are employed to lead support a plurality of components 3, which are disposed in a spaced apart relationship along the length of the tape. The axial lead components 3 are generally shown in the drawings as having a body portion 4 and a pair of leads 5a and 5b, which extend axially from opposite ends thereof. For purposes of reference, body portion 4 is considered as having a length measured between the opposite ends thereof and a thickness measured in a direction normal to the axes of leads 5a and 5b. Further, it will be understood that the components to be processed may be of varying body portion thicknesses and lengths, as indicated in FIGS. 4b, 4c and 4d.

As in the case of conventional fixed head insertion machines, the apparatus of the present invention is adapted in sequence to feed insertion tape 2; sever leads 5a and 5b of successively presented components 3 in order to separate a presented component from tapes 2a and 2b; deform the free end portions of the severed leads to provide generally L-shaped leads; and insert the deformed leads into preformed apertures 6a and 6b provided in a circuit board, designated as 6. After insertion of the deformed leads, the free ends thereof, which project below circuit board 6, may be clinched to retain them in inserted position by any suitable clinching mechanism 7, which includes clinching devices 7a and 7b, as indicated in phantom in FIG. 4b.

Circuit board 6 may be adjustably position below the insertion apparatus by any conventional supporting apparatus, not shown, which is adapted to be driven in X, Y direction by electric motors $M_1$ and $M_2$, shown only in FIG. 9.

While the specific structure of clinching mechanism 7 forms no part of the present invention, it is necessary to the practice thereof to mount clinching devices 7a, 7b in such a manner that they may be simultaneously moved in opposite directions with respect to a center or reference plane of the insertion apparatus which is designated as 8 in the drawings, in order to permit clinching of component leads inserted on different lead centers, i.e. the distance between axes of the free ends of the L-shaped leads. One means for effecting simultaneous adjustment of devices 7a, 7b is to employ a screw shaft 9 having oppositely threaded, equal pitch screw sections 9a, 9b, which is adapted to be selectively driven in opposite directions by an electric motor $M_3$. Clinching devices 7a, 7b, when properly adjusted, may be simultaneously actuated by a suitable pneumatically operated drive cylinder c-3. Further, as indicated in phantom in FIG. 4b, micro or limit switch LS4 may be employed to indicate to the control system of the present apparatus, which will be hereinafter described with reference to FIG. 9, that the clinching operation is completed.

Referring to FIGS. 1–3 it will be seen that apparatus 1 generally includes framework 10, which includes a generally U-shaped metal casting 11 having vertically disposed backwall portion 12 and leg portions 13, 13'. Leg portions 13, 13' are provided with aligned bore openings adapted to support a plurality of spaced parallel shafts including insertion head drive shaft 14; insertion head transverse guide shafts 15 and 16; insertion head transverse adjustment screw shaft 17 having oppositely threaded equal pitch screw sections 17a, 17b; insertion tape advancing shaft 18; and insertion head support return shaft 19. Leg portions 13, 13' are further shown in FIGS. 1 and 3 as having mounting flange portions 20, 20' which may be suitably affixed thereto, as by welding.

The structural arrangement of apparatus 1 thus far described is adapted to support an insertion head assembly, generally designated as 100; a component tape guide and feeding assembly which is generally designated as 200 and adapted to present a component to head assembly 100 for processing once during each operational cycle of the apparatus; and an insertion head actuating mechanism, which is generally designated as 300 and adapted to operate assembly 100 each time a component is presented thereto.

Figure 7:
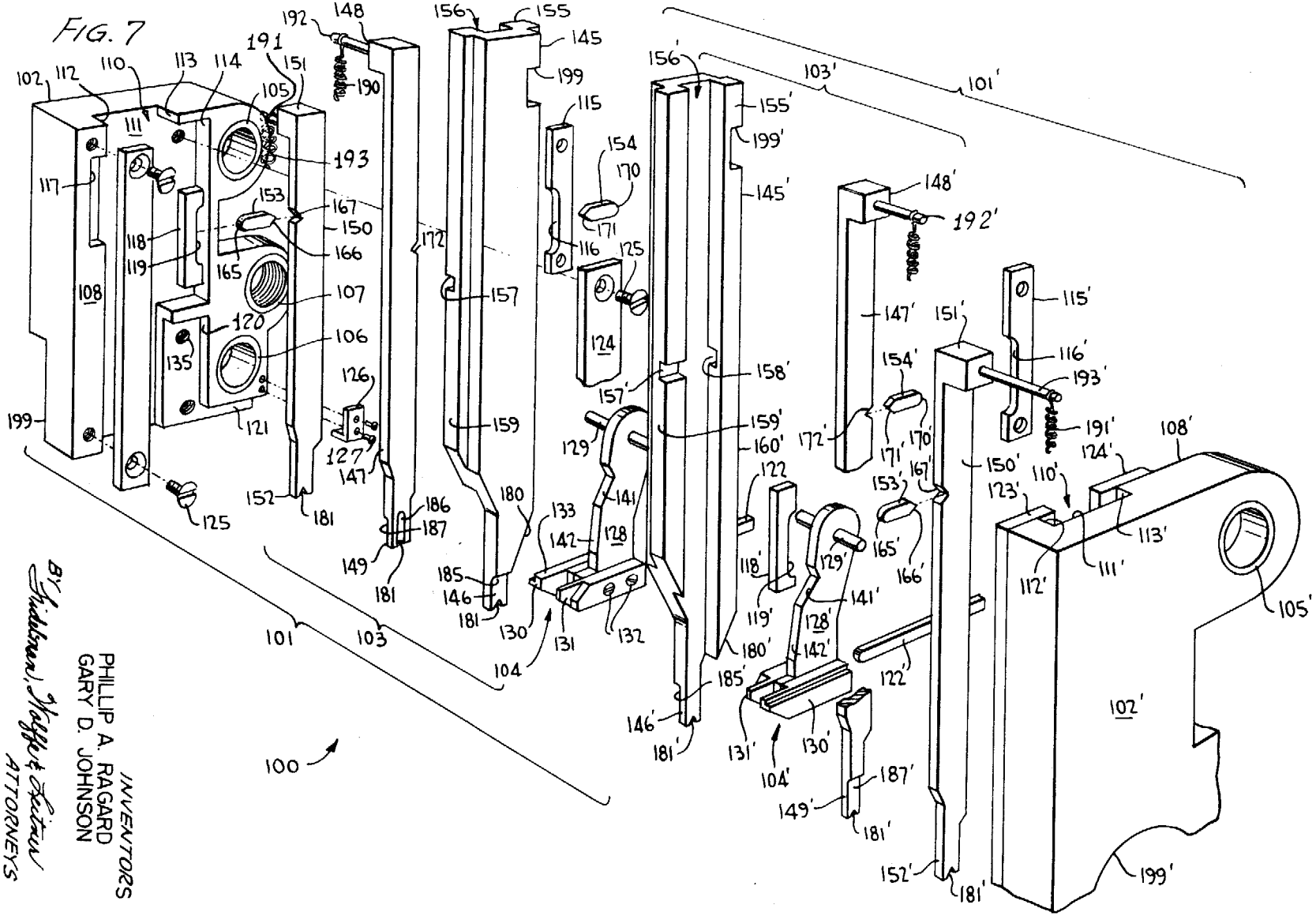
FIG. 7 is an exploded view of the insertion head of the present invention.

Insertion head assembly 100 is shown particularly in FIGS. 1, 2 and 7 as including a pair of relatively spaced apart insertion head sections 101, 101' which are of mirror image construction and disposed on opposite sides of a vertically extending reference plane 8. In that each of sections 101, 101' includes like elements, primary reference will be made to section 101, it being understood, however, that like elements of section 101' will be indicated by primed numbers.

Sections 101 and 101' are shown particularly in FIG. 2 and 7 as including a base casting members 102, 102', which are adapted to slidably support lead severing, forming and driver subassemblies 103, 103' and pivotably support a component lead support subassemblies 104, 104'.

Base casting member 102 is shown particularly in FIG. 2 and 7 as having a pair of ball bearing sleeve inserts 105 and 106, which are adapted to slidably receive guide shafts 15 and 16, respectively, and inset 107, which is adapted to threadably receive screw shaft 17. It will be understood by viewing FIG. 1 that inserts 107, 107' of base casting members 102, 102' cooperate with oppositely threaded screw shaft sections 17a, 17b, respectively, such that upon rotation of screw 17 insertion head sections 101, 101' are forced to slide on shafts 15 and 16 in opposite directions with respect to center plane 8. Rotation of screw shaft 17 in opposite directions to force head sections 101, 101' to move through equal distances either towards or away from reference plane 8 may be effected by any suitable means, such as a motor $M_4$, mounted on casting leg portion 13.

Again referring to FIGS. 2 and 7, it will be seen that the facing surface portions 108, 108' of base castings 102, 102' are cut out to provide lengthwise extending slots 110, 110' having a bottom walls 111, 111' and side walls 112, 112' and 113, 113' which are adapted to slidably receive subassemblies 103, 103' respectively. The facing surface portions 108, 108' are further provided as shown particularly in the case of base casting 102 with a first slot side opening recess 114, which is adapted to receive a forming tool cam plate 115 having a camming recess 116; a second slot side opening recess 117, which is adapted to receive severing tool cam plate 118 having a camming recess 119; a third slot side opening recess 120, which is adapted to receive lead support subassembly section 104; and a bottom edge slot 121; which is adapted to slidably receive support subassembly return pin 122. Suitable retention plates 123 and 124 may be affixed to facing surface 108 of base casting member 102 by machine screws 125 for the purpose of maintaining cam plates 115, 118 and subassemblies 103, 104 in position. A generally L-shaped bracket 126, which is mounted on base casting member 102 by machines screws 127 cooperates with retention plate 124 to maintain return pin 122 within edge slot 121.

Figure 4:
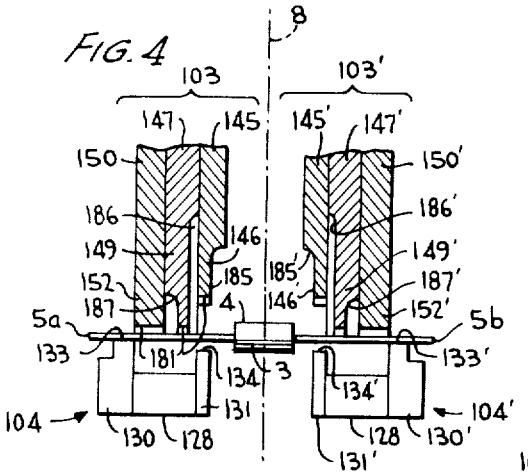
FIG. 4 is a sectional view taken generally along the line 4—4 of FIG. 2 but having portions broken away for clarity.
Figure 4A:
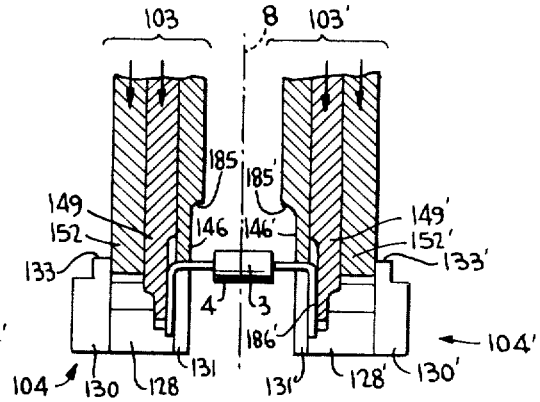
FIGS. 4a and 4b are sectional views similar to FIG. 4, but illustrating successive steps in the component lead severing, bending and insertion sequence.
Figure 4B:
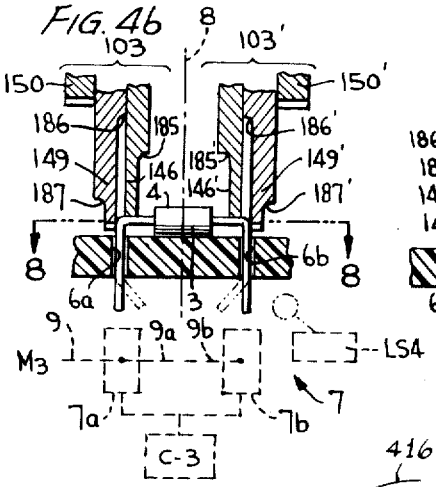
Figure 4C:
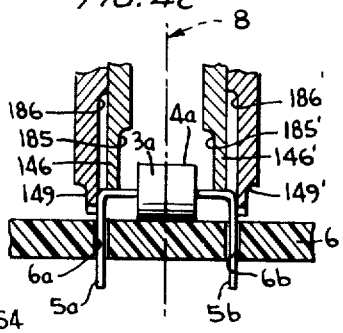
FIGS. 4c and 4d are views similar to FIG. 4b, but showing the component inserter head sections adjusted to accommodate variable size components.
Figure 4D:
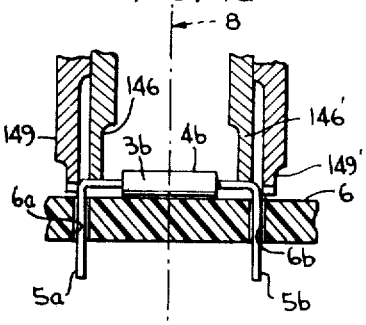

In FIGS. 2, 4 and 7 support subassembly 104 is shown as including a pivot arm 128 having a pivot pin shaft 129 affixed adjacent the upper end thereof; a lead severing block 130; and a lead support block 131. Blocks 130 and 131 may be suitably affixed on opposite sides of the lower or other end of pivot arm 128, as for instance by means of machines screws 132. Preferably, the upperwardly facing surface 133 of severing block 130 is disposed vertically above the upwardly facing surface 134 of support block 131 a distance corresponding to the maximum thickness or diameter of the leads of components to be severed, as generally indicated in FIGS. 4 and 4A. This insures that the component leads will be severed prior to the initiation of the deforming operation in order to prevent undue stressing of the leads.

Subassembly 104 is adapted to be pivotally supported within base casting member recess 120 by means of pivot pin 129, whose ends are received respectively within bore opening 135 of base casting member 102, shown only in FIG. 7, and bore opening 136 of retention plate [123] *124* shown only in FIG. 2. When thus supported, subassembly 104 is adapted to be normally maintained in its supporting position, illustrated in FIGS. 1, 2 and 4 and 4A, by means of an assembly shown in FIGS. 2 and 3 as including return pin 122; abutment 137 carried on return shaft 19; and a tension spring 138, which has its respective ends affixed to leg portion 13' by pin support 139, and return shaft 19 by pin 140. Preferably, subassembly 104 is prevented from being pivoted in a clockwise direction past its supporting position, as viewed in FIG. 2, due to the operation of tension spring 138, by abutting engagement with subassembly 103. It will be understood that abutment 137 and also the corresponding abutment for return pin 122', which is not shown in the drawings, is of sufficient length in a direction measured axially of shaft 19 to insure engagement thereof with return pins 122, 122' in all adjusted positions of head sections 101, 101', respectively.

Pivot arm 128 is provided with cam surfaces 141 and 142, which are adapted to cooperate with subassembly 103 in the manner to be hereinafter discussed, for the purpose of pivoting subassembly 104 from its operative or component supporting position, as viewed in FIG. 2, in a counterclockwise direction into an inoperative position to permit subassembly 103 to move downwardly towards circuit board 6 into a component lead insertion position. In this respect, it will be apparent that when subassembly a 104 is pivoted in a counterclockwise direction, return pin 122 is forced to slide within slot 121 thereby forcing abutment 137, return shaft 19 and pin 140 to move in a counterclockwise direction, also as viewed in FIGS. 2 and 3 and placing spring 138, under increased tension.

Lead severing, forming and driver subassembly 103 is shown particularly in FIGS. 2 and 7 as including a lead driving member 145 having an integrally formed driving tool 146 disposed adjacent the lower end thereof; a lead forming member 147 having integrally formed abutment 148 and forming tool 149 disposed adjacent the upper and lower ends thereof, respectively, a lead severing member 150 having an integrally formed abutment 151 and severing tool 152 disposed adjacent the upper and lower ends thereof, respectively; and forming and severing member cam pins [153] *154* and [154] *153*, respectively.

More specifically, driving member 145 is shown as having a side wall surface 155 in which is disposed a lengthwise extending slot 156 adapted to slidably receive forming member 147 and severing member 150, which are arranged in juxtaposed relationship. Further, driving member 145 is provided with relatively off-set slots 157, 158, which extend transversely from slot 156 through member front and rear wall surface 159, 160, and are adapted to slidably receive cam pin 153 and 154, respectively. It will be understood that when cam pin 153 is slidably disposed within slot 157, its curved end portion 165 is adapted to be selectively projected through member front wall 159, for the purpose of cooperating with camming recess 119 of cam plate 118, and its wedge-shaped end 166 is adapted to be selectively projected into slot 156 for the purpose of cooperating with V-shaped slot recess 167 provided in severing member 150. In a like manner, cam pin 154 is provided with a curved end portion 170, which is adapted to be selectively projected through rear wall surface of member 156 into cooperating engagement with recess 116 of cam plate 115, and a wedge-shaped portion 171 which is adapted to selectively project into slot [156] *158* into cooperating engagement with a V-shaped slot 172 provided in lead forming member 147.

When subassembly 103 is slidably positioned within base casting member slot 110, driving member side wall surface 155 and the outwardly facing side surface of severing member 150 are disposed in sliding surface engagement with slot bottom wall 111 as generally indicated in FIGS. 1 and 7 and driving member front and rear wall surfaces 159 and 160 are disposed in sliding surface engagement with slot side walls 112 and 113, respectively as generally shown in FIG. 2. When sub-assembly 103 is thus positioned, camming surface 180 of driving member 145 is operatively aligned with cam follower surfaces 141 and 142 of pivot arm 128, and driving tool 146, forming tool 149 and severing tool 152 are positioned with respect to severing block 130 and support block 131 of subassembly 104 in the manner indicated in FIG. 4.

Tools 146, 149 and 152 are shown primarily in FIGS. 4 and 7 as being provided with aligned, generally V-shaped, downwardly opening slots 181 which are adapted to receive lead 5a of component 3. Also, it will be seen that the surface of tool 146 disposed in a facing relation with respect to reference plane 8 is machined away, as at 185, to afford clearance between the driving tool and the body portion 4 of the component. Further, forming tool 149 is shown as having a lead receiving and guide slot 186, which extends upwardly from adjacent V-shaped groove 181 and is disposed on the surface of tool 149 disposed in a sliding engagement with tool 146, and as being machined away as at 187 on the surface thereof which slidably engages severing tool 152 in order to maximize clearance between the forming tool and the leads of a component which has been previously inserted into board 6.

Lead forming members 147, 147' and lead severing members 150, 150' are normally biased in a vertically downward direction by means of tension springs 190, 190' and 191, 191' respectively. The tension springs may be suitably affixed adjacent the lower ends thereof to any vertically stationary part of the apparatus, such as base castings 102, 102' and adjacent their other or upper ends to pins 192, 192' and 193, 193' carried on lead forming member and lead severing member abutments 148, 148' and 151, 151' respectively.

The operational sequence of insertion head assembly 100 will best be understood by reference to FIGS. 4, 4a and 4b. In FIG. 4 subassemblies 103, 103' are shown as being in their upper position and subassemblies 104, 104' are shown as being in their operative or component supporting positions, wherein a component is lead supported on the upwardly facing shear block surfaces 133, 133' with V-shaped slots 181, 181' on tools 146, 149, 152 and 146', 149', 152 disposed above and in alignment with component leads 5a, 5b respectively.

Referring only to subassembly 103 for purposes of brevity, it will be understood that in the up position shown in FIG. 4, wedge-shaped end 166 of cam pin 153 is maintained in slot recess 167 of severing member 150 by engagement of its curved end portion 165 with base casting slot side wall 112 in order to lock severing member 150 for movement with driving member 145. Further, wedge-shaped end 171 of cam pin 154 is maintained in slot recess 172 of forming member 147 by engagement of its curved end portion 170 with base casting slot side wall 113 in order to lock forming member 147 for movement with driving member 145.

Thereafter, when driving member 145 is driven downwardly in the manner to be described, tool 152 of severing member 150 is driven downwardly into engagement with component lead 5a and below upwardly facing shear block surfaces 133, to effect severing of the lead, and forming member tool 149 is positioned in engagement with the severed lead to maintain such lead tight against upwardly facing support block surface 134. Immediately thereafter downward movement of severing member 150 is terminated, due to engagement of member abutment 151 with base casting 102; the severing member being disconnected from driving member 145, due to the presence of severing tool cam plate recess 119, which permits cam pin 153 to ride out of slot recess 167. This arrangement prevents interference of severing tool 152 with previously inserted components.

After termination of severing member travel, forming tool 149 and driving tool 146 are moved into the position shown in FIG. 4a, whereat forming of an L-shaped lead has been completed with the free end of such lead preferably projecting downwardly below the end of guide slot 186, and the driving tool has been placed in engagement with the nondeformed or horizontally extending portion of the L-shaped lead.

Upon continued downward movement of tools 146, 149, subassembly 104 is removed from its operable position by the action of driving member cam surface 180 *on cam*

*surfaces 141 and 142 of pivot arm 128* to permit free movement of the tools towards the insertion position shown in FIG. 4b, wherein the free end of the deformed lead is inserted into board aperture 6a.

Preferably, tools 146, 149 move together until tool 149 is immediately adjacent the surface of circuit board 6 insure accurate insertion of the lead, whereafter movement of tool 149 is terminated due to engagement of forming member abutment 148 with base casting 102; forming member 147 being disconnected from driving member 145, due to the presence of forming tool cam plate recess 116, which permits cam pin 154 to ride out of slot recess 172. Thereafter, tool 146 continues its downward movement in order to drive the lead downwardly through forming member guide slot 186 into fully inserted position.

It will be understood that although the insertion position of tool 146 may be varied to compensate for variable component body portion thicknesses or diameters, as will hereinafter be described, the insertion position of tool 149 is constant since it depends solely on the positioning of forming tool cam plate recess 116.

Upon return movement of driving member 145, spring 190 functions to initially constrain movement of the forming member 147 therewith due to frictional forces, until cam pin 154 is returned into alignment with forming members slot recess 172, whereupon cam pin 154 is forced to ride out of forming tool cam plate recess 116 and be forced back into slot recess 172. In a similar manner, spring 191 functions to constrain severing member 150 until cam pin 153 is again aligned with slot recess 167, whereupon the cam pin 153 is forced back in slot recess 167 as it is forced to ride out of severing tool cam plate recess 119.

Figure 8:
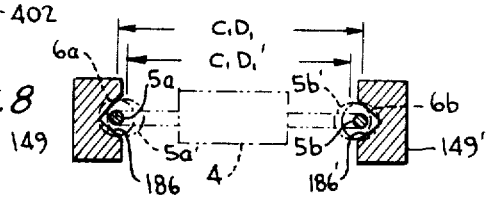
FIG. 8 is a sectional view taken generally along the line 8—8 of FIG. 4b.

The purposes for employing motor driven screw 17 to simultaneously force insertion head sections 101, 101' to move in opposite directions with respect to reference plane 8 will now become apparent from viewing FIGS. 4b, 4d and 8.

Turning first to FIGS. 4b and 4d, it will be understood that the lengths of body portions 4 and 4b of presently available components 3, 3b may vary substantially, and thus a conventional fixed head inserter designed to handle small FIG. 4b sized components cannot accommodate FIG. 4d sized components due to limited spacing between driving tools 146, 146'. Alternatively, if a fixed head inserter were designed to accommodate the larger sized 3b component, not only is the number of components which may be inserted in a given board greatly reduced, but problems of lead damage are off-times encountered when small sized components are inserted, due to excessive lengths of exposed above the board surface. By providing for selective adjustment of the insertion head in accordance with the present invention, not only may circuit board density be maximized but where desired, the leads of the components may be inserted at board terminal positions specified by a circuit board designer.

In FIG. 8 there is illustrated a problem off-times encountered with fixed head inserters, when employing components having leads which vary substantially in diameter. Conventionally, for purposes of convenience and to maximize board strength, the size or diameter of all apertures 6a, 6b for any given board is the same, apertures are positioned on the same C.D., and the apertures are only slightly larger than the maximum lead diameter expected to be employed. Thus, it has been the practice with fixed head inserters to set the spacing between formers 149, 149' so as to position the smallest diameter lead encountered, e.g. 5a, 5b shown in section, as closely adjacent opposites facing sides of apertures 6a, 6b, as possible, with a view to centering large diameter leads e.g. 5a', 5b', shown in phantom, within the apertures. However, as will be apparent from viewing FIG. 8, this procedure often results in improper positioning of large diameter component leads, whose effective C.D. may be significantly smaller than the effective C.D. of leads 5a, 5b. By utilization of the present invention the spacing between forming members 149, 149' may be varied to obtain a desired C.D. regardless of component lead diameter, and thus insure accurate orientation of the leads with respect to the board apertures.

Insertion tape guide and feed assembly 200 includes as in the case of insertion head assembly 100, a pair of guiding and feeding sections 201, 201', which are of mirror image construction and disposed on opposite sides of apparatus reference plane 8. Referring to FIGS. 1–5, it will be understood that sections 201, 201' are mounted on framework mounting flange portions 20, 20' for adjustment relative to apparatus reference plane 8 by means of brackets having first and second flange portions 202, 202' and 203, 203', respectively. Bracket flange portions 202, 202' may be locked in a desired adjusted position by means of clamping bolts 204, 204', which are freely received within bracket flange slots such as slot 205 and threadedly received within mounting flanges 20, 20'.

By now referring particularly to FIGS. 1, 2 and 3, it will be seen that sections 201, 201' are provided with generally L-shaped lead guides 206, 206', which are pivotally affixed to bracket flanges such as flange 202 by means of pin shafts 207, 207'. The guides are adapted to be maintained in the position illustrated particularly in the case of guide 206 in FIGS. 1 and 2, by means of a thumb screws such as screw 208 which are threadably received within bracket flange portions 202, 202'. Referring particularly to FIG. 2, it will be understood that sections 201, 201' are also provided with stationary guides, shown only in the case of guide 207'', which are adapted to cooperate with pivotal guides 206, 206' to define a vertically extending component lead guide passageway 210.

Figure 5:
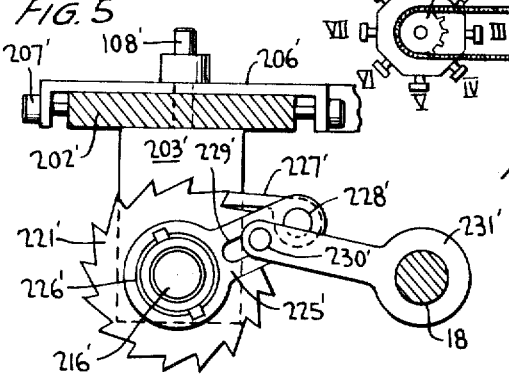
FIG. 5 is sectional view taken generally along the line 5—5 of FIG. 1.

Now referring to FIGS. 1 and 5 and particularly to assembly section 201', it will be seen that flange portion 203' is bored to receive a bearing insert 215' in which is journaled a shaft 216' having a component lead advancement wheel 217' carried thereon. As will be clearly seen by reference to FIG. 1 advancement wheels of each section are provided with radially extending annular rim portions 218, 218' having a plurality of circumferentially spaced generally V-shaped lead receiving slots 219, 219', which are disposed in alignment. As best seen in the case of section 201 when viewed in FIG. 2, the lower ends of pivotable guides 206, 206' form continuations of the upwardly facing surfaces 133, 133' of severing blocks 130, 130' and serve to maintain the component leads *5a, 5b* within slots 219, 219', as successive components are presented to the insertion assembly by rotation of advancement wheels 217, 217'. Preferably, the spacing between slots 219, 219' corresponds to the minimum standard spacing between components on tape 2.

It will be noted at this point that assembly sections 201, 201' may be adjusted with reference to apparatus reference plane 8, so as to permit adjustment wheel rim portions 218, 218' to engage the relatively inwardly facing marginal edges of component carrier tapes 2A and 2B and thereby effect positioning of the components carried by such tapes in proper orientation with respect to apparatus reference plane 8, and thus sections 101 and 101' of the insertion head assembly. Also, it will be noted that the insertion section base castings 102 and 102' are each cut out, at 199, 199', to freely receive component advancement wheels 217, 217' in order to permit relative adjustment of sections 101, 101' after the distance between sections 201, 201' has been set for a given width carrier tape.

Component lead advanceemnt wheels 217, 217' may be simultaneously rotated to draw insertion tape 2 downwardly through the lead guide slots by ratchet assemblies shown only in the case of section 201' in FIGS. 1 and 5 as including a ratchet wheel 221' having an integrally formed sleeve section 222' affixed for rotation with shaft 216' by a retaining pin [224'], *222'* a pivot member 225', which is freely supported for rotation with respect to ratchet sleeve 224' by sleeve bushing 226'; and a ratchet paw 227' which is carried on pivot member pivot pin shaft 228'. Pivot member 225' is shown in FIGS. 1 and 5 as having a slot 229' which is adapted to slidably receive pin shaft 230' carried on second member 231' mounted for rotation with insertion tape advancing shaft 18. Preferably, the number of teeth provided on ratchet wheel 221' corresponds to the number of slots on advancement wheel 217.

Now referring to FIG. 3, it will be understood that one end of shaft 18 projects outwardly beyond leg portion 13' and is adapted to carry flange portion 235, which is movably connected to piston rod 236 of pneumatic cylinder $C_1$ by means of pin shaft 237. The extent to which piston rod 236 may be retracted into cylinder $C_1$ upon operation thereof and thus the angle through which shaft is rotated is controlled by a top block 240, which is adapted to engage the undersurface of piston shaft enlargement 241. Stop block 240 may be moved from the position shown in FIG. 3 in order to permit piston rod 236 to be fully retracted, by loosening locking bolt 242, which is slidably disposed in stop block slot 243 and threadably received within framework leg portion 13'.

By viewing FIGS. 3 and 5 it will be understood that when piston rod 236 is retracted into engagement with stop block 240, ratchet paw 227' is stepped backwardly one tooth on ratchet wheel 221', whereas without stop block in position full retraction of piston rod 236 will cause ratchet paw 227' to step two ratchet teeth. Since the number of ratchet teeth stepped while "cocking" the ratchet assembly determines the degree of feeding rotation of advancement wheels 217, 217' when cylinder C–1 is actuated to extend rod 236, the number of ratchet teeth corresponds to the number of slots on advancement wheels 217 and 217' and the spacing between adjacent wheel slots corresponds to the minimum nominal spacing for standard carrier tapes, it will be apparent that stop block 240 may be employed to adjust the apparatus to handle insertion tapes having either standard nominal 200 thousands or 375 thousands spacing between components leads. In this respect, it will be understood that spacings between component leads of such standard tapes actually approximate 195 thousands and 390 thousands, respectively. If desired, tapes having variable component spacings to conserve tape length where both extremely large and relatively small diameter components are to be employed, may be accommodated by employing remotely controlled means to adjustably position stop block between insertion cycles.

Limit switch LS3, shown in FIG. 1 as being carried in leg portion 13, is employed to sense clockwise rotation of shaft 18, which results in rotation of advancement wheels 217, 217' to present component to insertion head 100.

Referring particularly to FIGS. 1, 2 and 3, it will be understood that driver members 145, 145' may be simultaneously reciprocated within base casting slots 110, 110' to move subassemblies 103, 103' from their first or uppermost position, into component lead inserting position by means of actuating assembly 300.

Actuating mechanism 300 includes a generally U-shaped driving bracket 301, which is fixed for rotation with drive shaft 14 and provided with a half-round driving pin 302 adapted to be slidably received within transversely extending cutouts 199, 199' of driver members 145, 145'; a stop bracket 303, which is fixed for rotation with one end of drive shaft 14 projecting outwardly through leg portions 13'; and a double acting pneumatic cylinder C–2. Cylinder C–2 is mounted on leg portion 13' by a bracket 304, and includes a piston rod 305 having a connecting pin 306, which is slidably received within stop bracket slot 307. By viewing FIG. 3, it will be apparent that when cylinder C–2 is actuated to retract piston rod 305, stop bracket 303 is pivoted in a counterclockwise direction into the position indicated in phantom to effect driving rotation of drive shaft 14 and thus, reciprocation of drive members 145, 145' towards their insertion position.

The other end of drive shaft 14, which is shown in FIG. 1 as projecting outwardly through leg portion 13, is adapted to carry a pair of cam members 308, 309. Cam members 308, 309 are adapted to cooperate with limit switches LS1 and LS2, respectively, which are mounted on leg portion 13 and employed to indicate to the control circuit of the insertion apparatus shown in FIG. 9 that subassemblies 103, 103' are in either their uppermost or insertion position.

In FIG. 3, stop bracket 303 is shown as being provided with a pin 310, which is adapted to be slidably received within slot 311 provided adjacent one end of a connecting rod 312. Connecting rod 312 is pivotably supported adjacent the other end thereof by a pin shaft 313, which is supported on bracket 314 affixed for rotation with return shaft 19. This arrangement serves, after component lead supporting subassemblies 104, 104' have been initially pivoted towards their inoperative positions by drive member cam surfaces 180, 180' to temporarily rotate return shaft 19 in a counterclockwise direction, as viewed in FIGS. 2 and 3, and thus temporarily remove abutments 137, 137' from positive engagement with return pins 122, 123'. Accordingly subassemblies 104, 104' are freed of the return bias of spring 138 in order to permit drive members 145, 145' to slide on pivot arm cam surfaces 142, 142' with a minimum amount of friction, as the drive members are reciprocated to and from insertion position. Upon the return of stop bracket 303 to its original or full line position shown in FIG. 3, connecting rod 312 is rendered inoperative in order to permit spring 138 to return support assemblied 104, 104' to their original supporting positions.

Figure 6:
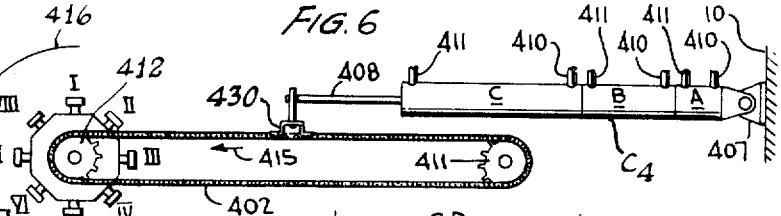
FIG. 6 is a view generally illustrating the insertion head motion limiting mechanism employed in the practice of the present invention.

Further, in accordance with the present invention there is provided a motion limiting mechanism, which is generally designated as 400 in FIGS. 3 and 6, and operates to limit the extent through drive members 145, 145' are reciprocated upon actuation of driver cylinder $C_1$. Motion limiting mechanism 400 generally comprises a stop block 401, a ternary pneumatically operated cylinder $C_4$, and an endless belt 402 which is adapted to transform reciprocating movement of cylinder $C_4$ into rotational movement of stop block 401.

Stop block 401 is freely mounted for rotation on guide shaft 15 by a ball bearing insert 403 and includes a plurality of threadably adjustable stop elements, as for instance eight elements indicated in FIGS. 3 and 6 by numerals I–VIII, which are spaced equally about the periphery of stop block 401. Stop elements I–VIII may be individually adjusted with respect to a zero reference surface 404, which is defined by a set block or gauge 405 mounted on leg portion 13' by machine screws 406. Preferably, one of the stop elements, as for instance element I, is adjusted to provide a minimum reference distance between such element and reference surface 404, and another of the stop elements, as for example element VIII, is adjusted to provide a maximum reference distance between such element and reference surface 404. Thereafter, the remaining stop elements are adjusted with respect to reference surface 404, so as to provide for instance an equal and progressive variation between the minimum and maximum reference distances.

The number of stop elements provided for any given insertion apparatus and the reference distances for which they are individually adjusted, will depend on the number of different insertion positions into which it is desired to drive members 145, 145' upon actuation of cylinder C–2; such insertion positions, i.e. the distance between tools 146, 146' and the surface of circuit board 6, in turn depending on the body diameters of the respective components to be inserted. Thus, if a maximum diameter component is to be inserted, e.g. component 4a of FIG. 4c stop element I, adjusted to minimum reference distance, would be positioned in the reference stop position shown in FIG. 3 to permit it to be engaged by stop bracket 303, when the latter is pivoted into its phantom line driving position. Since stop element I will permit the minimum degree of stop bracket pivotable movement, it follows that drive members 145, 145' are driven through a minimum distance, so as to permit maximum spacing between tools 146, 146' and circuit board 6. If on the other hand a minimum diameter component is to be inserted, e.g. component 4 of FIG. 4b stop element VII would be moved into the reference stop position in order to maximize the degree of stop bracket movement.

By permitting the insertion position of the drive members to be varied, the positioning of drive member tools 146, 146' is optimunized for any given component size from the standpoint of proper lead clinching. Further, the body portions of the components may be placed in desired supporting engagement with the surface of a circuit board regardless of body portion thickness.

In FIG. 6 ternary cylinder $C_4$ in shown as including three separate pneumatically operated cylinders designated as A, B and C each of which is provided with pressurized air inlet tubes 410 and vent tubes 411. Cylinder $C_4$ may be affixed adjacent cylinder A to framework 10 by any suitable bracket 407 and be provided with a piston rod 408, which is positively affixed to a link of endless chain 402, as at 430. Chain 402 may be trained about idler sprocket 411 and a suitable sprocket 412 which is affixed for rotation with stopblock 401. Thus, it will be seen that when piston rod 408 is extended to the left, as indicated by arrow 415 in FIG. 6, stop block 401 will be forced to rotate in a counterclockwise direction as indicated by arrow 416, in order successively to bring stop elements II–VIII in to the reference stop position. Accordingly, it will be readily aparent that by selectively introducing pressurized gas through inlet tubes 410 into one or more of cylinders A, B and C, stop block 401 may be rotated by a desired amount to position one of the stop elements I–VIII in the reference position shown as being occupied by element I in FIG. 3, wherein it will be engaged by stop bracket stop when I is latter is pivoted to the phantom line position shown.

If by way of example it is assumed that stop elements I–VIII are employed; stop element I is the reference stop element; and that cylinders A, B and C have ¼, ½ and 1 inch displacements, respectively, there can be developed the following chart showing the interrelation between cylinder actuation and stop block rotation.

| Stop element in ref. position | Cylinder A | Cylinder B | Cylinder C | Stop block revolution |
|---|---|---|---|---|
| I | − | − | − | 0 |
| II | + | − | − | ⅛ |
| III | − | + | − | ¼ |
| IV | + | + | − | ⅜ |
| V | − | − | + | ½ |
| VI | + | − | + | ⅝ |
| VII | − | + | + | ¾ |
| VIII | + | + | + | ⅞ |

NOTE.—(−) Cylinder Retracted; (+) Cylinder Extended.

OPERATION

In operation, a suitable memory element, such as a punched or magnetic tape, is coded to indicate the various component and circuit board parameters for each of the components to be supplied to the insertion to the apparatus during fabrication of a given circuit board. Thus, for each component to be inserted, the tape is coded to indicate a given X-Y board position, a given C.D. or distance between the component lead axes of a given diameter which is required in order to permit the leads to be properly inserted into prepunched board apertures; and the diameter or thickness of the body portion to of the component.

Figure 9:
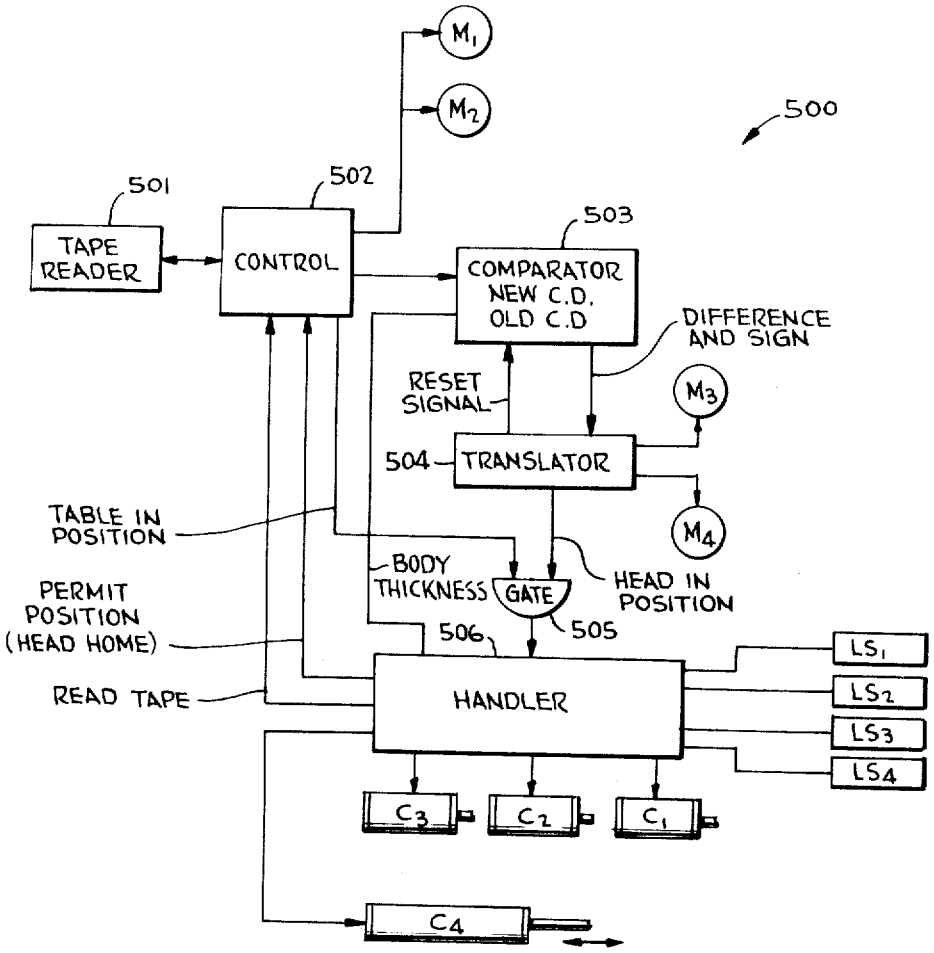
FIG. 9 is a diagrammatic view of the electrical and pneumatic circuit employed with the apparatus of the present invention.

The coded tape, not shown, is then employed to control operation of the control circuit of the apparatus, generally designated as 500 in FIG. 9, in the manner now to be described.

Operation is initiated by feeding the coded tape in a stepwise manner past a suitable tape reader 501, which signals a control mechanism 502 to begin component insertion cycle. Control 502 initiates the insertion cycle by actuating circuit board supporting table positioning motors $M_1$, $M_2$ to drive the circuit board into a given X=Y position, whereat prepunched board apertures 6a, 6b are disposed in alignment beneath insertion head assembly 100. Control 502 simultaneously supplies comparator 503 with information concerning the newbody portion thickness and the new component C.D. Coparator 503 recognizes the new body thickness and signals handler 506 to actuate ternary cylinder $C_4$ to move stop elements I–VIII into correct position, (as for instance element I into the reference stop position shown in FIG. 3.) Comparator 503 also compares the new C.D. with the old C.D. or C.D. of a previously inserted component. If the C.D.'s are different comparator 503 indicates to translator 504 the sign and difference between C.D.'s whereafter translator 504 actuates clinching mechanism section adjustment motor $M_3$ and insertion head section adjustment motor $M_4$ to drive the sections into proper position. Translator 504 then sends a reset signal back to comparator 503 to change the C.D. to be used as a reference during a succeeding insertion cycle. When adjustment of the clinching and insertion sections is completed, translator 504 transmits a head in position signal to gate 505 that the insertion cycle may proceed; the gate, upon also receiving a signal from control 502 that the circuit board table is in position, signals handler 506 to proceed.

If on the other hand, the new C.D. is identical to the old C.D., motors $M_3$, $M_4$ are not actuated and a head in position signal is sent immediately to gate 505.

Handler 506 thereafter initiates operation of control cylinders $C_1$, $C_2$ and $C_3$ in the following sequence. First, $C_1$ is operated to extend piston rod 236, whereby shaft 18 is rotated in a clockwise direction, when viewed in FIGS. 3 and 5 to effect driving rotation of advancement wheels 217, 217' via the ratchet assemblies to present the leads of a component to be inserted immediately adjacent the upwardly facing shear block surfaces 133, 133', as viewed in FIGS. 1 and 4. Full driving rotation of shaft 18 closes limit switch LS3 to signal handler 506 that a component is positioned. Handler 506 then actuates cylinder $C_2$, which retracts piston rod 305 in order to drive members 145, 145' into their insertion position previously determined by actuation of stop control cylinder $C_4$. When members 145, 145' are moved into insertion position, cam [308] *309* closes limit switch LS2 to signal the handler that a component has been inserted, whereupon the handler actuates cylinder $C_3$ to drive clinching devices 7a and 7b into lead clinching position and close limit switch LS4. Closing of switch LS4 signals handler 506 to deactivate cylinders $C_1$, $C_2$ and $C_3$ in order to return the feeding, insertion and clinching elements of the insertion apparatus to their original or inoperative positions.

As soon as operation of handler 506 is initiated, the handler signals control 502 to initiate feeding of the coded tape and reading of data corresponding to the next component to be inserted. Upon [return] *returning* members 145, 145' to their original positions at the completion of the insertion cycle, cam 308 closes limit switch LS1, whereupon handler 506 gives a permit signal to control 502 to proceed with a subsequent operational cycle.

While only the preferred embodiment of the present invention has been described in detail, various modifications thereof and additions thereto will become apparent to those skilled in the art in view of the foregoing description. For example, the machine has been described for use specifically with axial lead components having single leads extending from each end thereof while one skilled in the art would recognize that the axial lead component could have more than one lead extending from an end, suitable provision being made in the operating mechanism to cut, bend and insert the multiple leads. Further, it will likely occur to one skilled in the art that the present invention has utility in processing components where it is only desired to trim and deform components to provide processed components which may thereafter be inserted by other insertion apparatus.

Accordingly, the scope of protection for the present invention is to be limited only by the scope of the appended claims.

We claim:

1. An apparatus for processing electrical components each having a body portion and a pair of leads extending from opposite ends thereof which comprises: a head assembly having first and second relatively spaced apart sections; means adapted to actuate said sections during each operational cycle of said apparatus; and means adapted to present one of said component to said head assembly during each operational cycle of said apparatus in such a manner that the leads of said presented component are operably positioned one adjacent each of said sections with said component body portion being disposed between said sections, each said section when actuated being adapted to sequentially sever a length from one lead of said presented component to produce a shortened component lead and thereafter deform a free end portion of said shortened lead to produce a generally L-shaped lead; means adapted to vary the spacing between said sections; and control means operable to actuate said section spacing varying means, whereby the distance measured between the free ends of said deformed leads of components processed during successive operational cycles of said apparatus may be varied in a predetermined manner.

2. An apparatus according to claim 1, wherein said component presenting means includes two relatively spaced apart axially aligned feed wheels disposed adjacent opposite sides of said head assembly, each said feed wheel having a plurality of equally spaced apart recesses disposed adjacent the periphery surface thereof, said wheel recesses being arranged to form periphery-spaced pairs of aligned recesses, the respective recesses of each said pair being adapted to engage the respective leads of a component to be presented, and means to effect rotation of said feed wheels to present one of said components to said head assembly during each operational cycle of said apparatus.

3. An apparatus according to claim 2, wherein components to be presented to said head assembly are lead supported by a pair of parallel carrier tapes, said feed wheels are provided with radially extending annular guide surfaces, said guide surfaces being adapted to guidingly engage facing marginal edge portions of said carrier tapes to effect desired positioning of said components with respect to said head assembly in a direction lengthwise of said component body portion between said ends thereof, and means are provided to vary the distance between said feed wheels in accordance with the spacing between said facing marginal edges of said tapes.

4. An apparatus according to claim 2, wherein components to be presented to said head assembly are lead supported by a pair of parallel a carrier tapes, and said means to effect rotation of said feed wheels includes means selectively operable to vary feeding rotation of said feed wheels in accordance with the spacing between components carried on said tapes.

5. An apparatus according to claim 1, wherein said section spacing varying means includes guide means adapted to slidably support said sections for reciprocation along aligned paths of travel, and shaft means aligned with said paths of travel, said shaft means having oppositely threaded equal pitch screw portions, each said section being adapted to threadably receive one of said screw portions; and said control means includes motor means adapted to selectively rotate said shaft means in opposite directions, whereby said sections are forced to slide on said guide means in opposite directions.

6. An apparatus according to claim 1, wherein said component body portion has a thickness when measured normal to a line extending between said ends thereof, said sections include means adapted when moved into a position adjacent a circuit board to insert said free ends of said deformed L-shaped leads into preformed apertures provided in said circuit board, and means are provided to adjustably vary said insertion position of said insertion means in accordance with said thickness of said presented component.

7. An apparatus for processing electrical components each having a body portion and a pair of leads extending from opposite ends thereof, which comprises: a head assembly having first and second relatively spaced apart sections; means adapted to actuate said sections during each operational cycle of said apparatus; means adapted to present one of said components to said head assembly during each said operational cycle in such a manner that the leads of said presented component are operably positioned one adjacent each of said sections with said body portion being disposed therebetween, each of said sections when actuated being adapted to sequentially deform one of said presented component leads to produce a generally L-shaped lead and thereafter insert the free end of said deformed lead into one of a pair of spaced preformed apertures provided in a circuit board; means adapted to vary the distance between said sections *by simultaneously moving said sections in opposite directions* in order to vary the spacing between said free ends of said deformed leads; and means to adjustably control operation of said varying means in accordance with the spacing between said preformed apertures into which said deformed leads are to be inserted.

8. An apparatus according to claim 7, wherein said component body portion has a thickness when measured normal to a line [extends] *extending* [,] between said ends thereof, said sections include means mounted for reciprocation during each operational cycle of said apparatus between a first position and a deformed lead insertion position, and means is provided to vary said insertion position in accordance with said thickness of said body portion of said presented component.

9. An apparatus for inserting into a board the leads of electrical components characterized by a body portion and a pair of leads extending axially from opposite ends thereof, which comprises: a head assembly having first and second relatively spaced apart sections; means to actuate said sections during each operational cycle of said apparatus; means adapted to present one of said components to said head assembly during each operational cycle of said apparatus in such a manner that the leads of a presented component are operably positioned one adjacent each of said sections with said body portion of said component being disposed between said sections, each said section when actuated being adapted to sequentially sever a length from one lead of said presented component to produce a shortened component lead, deform a free end portion of said shortened lead to produce a generally L-shaped lead and thereafter drive said free end portion of said L-shaped lead into said board; means adapted to simultaneously move said sections in opposite directions to vary the spacing therebetween; and control means operable to actuate said section moving means.

10. An apparatus according to claim 9, wherein said body portions of components presented for insertion during successive operational cycles of said apparatus may vary in thickness when measured in a direction normal to said axially extending leads, each said section includes a deformed component lead driving tool mounted for reciprocation between a first position and a second deformed lead insertion position during each operational cycle of said apparatus, and said section actuating means being controllable by said control means such that said insertion position of said driving tool may be varied in accordance with thickness of the body portion of components presented during successive operational cycles of said apparatus.

11. An apparatus according to claim 9, wherein components to be presented to said head assembly are lead supported by a pair of parallel carrier tapes, and said component presenting means includes two relatively spaced apart axially aligned feed wheels disposed adjacent opposite sides of said head assembly, each said feed wheel having a plurality of equally spaced apart recesses disposed adjacent the peripheral surface thereof, said wheel recesses being arranged to form peripherally spaced pairs of aligned recesses, the respective recesses of each said pair being adapted to engage the respective leads of a component to be presented, said feed wheels further having radially extending annular guide surfaces adapted to guidingly engage facing marginal edge portions of said carrier tapes to effect positions of said presented component with respect to said head assembly in a direction lengthwise of said component body portion between said ends thereof; and means to effect rotation of said feed wheels to present one of said components to said head assembly during each operational cycle of said apparatus, said rotation effecting means including means selectively operable to vary feeding rotation of said feed wheels in accordance with the spacing between components carried on said tapes.

12. An apparatus according to claim 9, wherein each said section includes a base means; a first subassembly mounted on said base means for movement between a presented component lead supporting position and an inoperable position during each operational cycle of said apparatus; and a second subassembly, said second subassembly includes: component lead shear means, component lead deforming means, and deformed component lead driving means, said driving means being supported for reciprocation on said base means, said shear means and said deforming means being carried on said driving means, said section actuating means being operable to effect reciprocation of said driving means with respect to said base means between a first position and a deformed lead insertion position once during each operational cycle of said apparatus, said driving means when reciprocated to said insertion position being adapted sequentially to operably position said shear means and said deforming means with respect to said first subassembly when in said supporting position to effect severing and deforming of said presented leads to effect movement of said first subassembly to said inoperable position, and to effect driving of said deformed lead into said board, and said section moving means being adapted to vary the spacing between said base means.

13. An apparatus according to claim 12, wherein said section moving means includes guide means adapted to slidably support said base means for reciprocation along aligned paths of travel disposed normal to the paths of reciprocation of said driving means, and shaft means aligned with said paths of travel, said shaft means having oppositely threaded equal pitch screw portions, each said base means being adapted to threadably receive one of said screw portions, and said control means includes motor means adapted to selectively rotate said shaft means in opposite directions, whereby said base means are forced to slide on said guide means in opposite directions.

14. An apparatus according to claim 12, wherein said section actuating means includes powered means, means to transmit movement of said powered means simultaneously to each of said driving means to effect reciprocation thereof from said first to said insertion position, and stop means adapted to adjustably vary operation of said motion transmitting means to effect adjustment of said insertion position, said control means being operable to adjust said stop means, and each said driving means is slidably connected to said motion transmitting means for movement in a direction transversely of said path of reciprocation thereof to permit varying of the spacing between said base means.

15. An apparatus according to claim 9, wherein each said section includes a base means having an open ended slot therein, said slot having side walls including guide surfaces and first and second cam surfaces; a component lead support subassembly, said subassembly being pivotably mounted on said base means for movement between a presented component lead supporting position and an inoperable position; a deformed lead driving means, said driving means being slidably supported by said guide surfaces for reciprocation within said slot of said base means, said driving means having an open ended lengthwise extending slot disposed in alignment with said base slot and first and second open ended slots disposed in communication with said lengthwise extending slot and extending transversely thereof, said section actuating means being operable to effect reciprocation of said driving means within said base slot between a first position and a deformed lead insertion position during each operational cycle of said apparatus, said driving means being operable to move said supporting subassembly from said supporting position after severing and deforming of said leads; a presented component lead severing means, said severing means having first abutment means and a first notch recess in one surface thereof, and said severing means cooperating with said supporting subassembly when in supporting position to sever a lead; a severed lead deforming means, said deforming means having second abutment means and a second notch recess in one surface thereof, said deforming means cooperating with said supporting subassembly when in supporting position to deform a lead, said severing means and said deforming means being slidably supported within said lengthwise extending slot of said driving means for independent reciprocating movement in alignment with the path of reciprocation of said driving means; a first cam element slidably received within said first slot of said driving means and having one end portion thereof adapted to be removably received within said first notch recess of said severing means to lock said severing means for movement with said driving means during reciprocation thereof from said first position of said driving means and having another end portion thereof adapted to slidably engage said base slot guide and first cam surfaces; a second cam element slidably received within said second slot of said driving means and having one end portion thereof adapted to be removably received within said second notch recess of said deforming means to lock said deforming means for movement with said driving means during reciprocation thereof from said first position of said driving means and having another end portion thereof adapted to slidably engage said base slot guide and second cam surfaces, said first abutment means when moved into a first position subsequent to severing of a lead cooperating with said first cam surface to permit removal of said one end portion of said first cam element from said first notch recess of said severing means to effect unlocking thereof with respect to said driving means, said second abutment means when moved into a first position subsequent to deforming of a lead cooperating with said second cam surface to permit removal of said one end portion of said second cam element from said second notch recess of said deforming means to effect unlocking thereof with respect to said driving means; and means to insure locking of said severing means and said deforming means to said driving means during reciprocation thereof from said insertion position to said first position thereof.

*16. An apparatus according to claim 7, wherein said section distance varying means includes guide means adapated to slidably support said sections for reciprocation along aligned paths of travel, and shaft means aligned with said paths of travel, said shaft means having oppositely threaded equal pitch screw portions, each said section being adapted to threadably receive one of said screw portions, and said control means includes motor means adapted to selectively rotate said shaft means in opposite directions, whereby said sections are forced to slide on said guide means in opposite directions.*

References Cited

The following references, cited by the Examiner, are of record in the patented file of this patent or the original patent.

UNITED STATES PATENTS

| | | | |
|---|---|---|---|
| 2,808,587 | 10/1957 | Hancock | 227—2 |
| 2,896,213 | 7/1959 | Alderman et al. | 227—1 X |
| 2,982,967 | 5/1961 | Dingelstedt | 227—90 |
| 3,078,466 | 2/1963 | Harrold et al. | 227—21 |
| 3,167,780 | 2/1965 | Mueller | 227—90 X |
| 3,291,359 | 12/1966 | Butterworth et al. | 227—155 |

GRANVILLE Y. CLUSTER, Jr., Primary Examiner

U.S. Cl. X.R.

227—90, 136